US008155256B2

(12) United States Patent
Staszewski et al.

(10) Patent No.: US 8,155,256 B2
(45) Date of Patent: Apr. 10, 2012

(54) METHOD AND APPARATUS FOR ASYNCHRONOUS CLOCK RETIMING

(75) Inventors: Robert B. Staszewski, Garland, TX (US); Kenneth J. Maggio, Dallas, TX (US); Dirk D. Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3033 days.

(21) Appl. No.: 09/969,307

(22) Filed: Oct. 2, 2001

(65) Prior Publication Data
US 2002/0131538 A1 Sep. 19, 2002

Related U.S. Application Data

(60) Provisional application No. 60/242,577, filed on Oct. 23, 2000.

(51) Int. Cl.
*H04L 7/00* (2006.01)
(52) U.S. Cl. ........ 375/355; 375/360; 375/373; 375/375; 375/354; 370/337; 370/516
(58) Field of Classification Search .................. 375/355, 375/354, 360, 371; 327/165; 370/337
See application file for complete search history.

(56) References Cited

U.S. PATENT DOCUMENTS

| | | | | | |
|---|---|---|---|---|---|
| 5,212,716 | A | * | 5/1993 | Ferraiolo et al. .............. | 375/373 |
| 5,539,784 | A | * | 7/1996 | Brauns et al. .................. | 375/360 |
| 5,594,735 | A | * | 1/1997 | Jokura ........................... | 370/337 |
| 5,886,552 | A | * | 3/1999 | Chai et al. ...................... | 327/165 |
| 6,031,886 | A | * | 2/2000 | Nah et al. ....................... | 375/375 |
| 6,175,603 | B1 | * | 1/2001 | Chapman et al. .............. | 375/354 |
| 6,326,851 | B1 | | 12/2001 | Staszewski et al. | |
| 6,327,684 | B1 | * | 12/2001 | Nadeau-Dostie et al. ..... | 714/731 |
| 6,738,442 | B1 | * | 5/2004 | Wilcox .......................... | 375/360 |

FOREIGN PATENT DOCUMENTS

| | | |
|---|---|---|
| EP | 0 427 509 A2 | 5/1991 |
| EP | 0 490 273 A2 | 6/1992 |

OTHER PUBLICATIONS

Metastability in electronice; Wikipedia, encyclopedia; pp. 1-3.*
Zhang, Benyong, et al., "Feed-Forward Compensated High Switching Speed Ditigal Phase-Locked Loop Frequency Synthesizer," IEEE 1999, pp. IV-371-IV-374.
Bopp, Mathias, et al., "A DECT Transceiver Chip Set Using SiGe Technology," ISSCC99/Session 4, Paper MP 4.2, 1999 IEEE International Solid-State Circuits Conference, pp. 68, 69, 447.

* cited by examiner

*Primary Examiner* — Eva Puente
(74) *Attorney, Agent, or Firm* — Ronald O. Neerings; Wade James Brady, III; Frederick J. Telecky, Jr.

(57) ABSTRACT

A time to digital converter is used to determine which edge of the higher frequency clock (oversampling clock) is farther away from the edge of the lower frequency timing signal. At the same time, the oversampling clock performs sampling of the timing signal by two registers: one on the rising edge and the other on the falling edge. Then, the register of "better quality" retiming, as determined by the fractional phase detector decision, is selected to provide the retimed output.

28 Claims, 6 Drawing Sheets

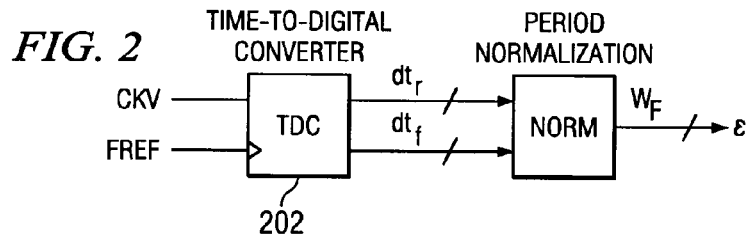
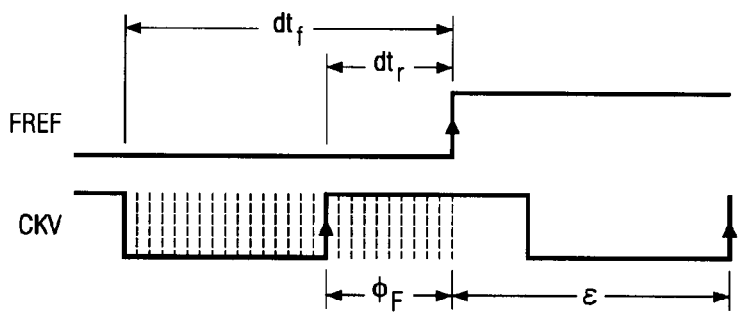
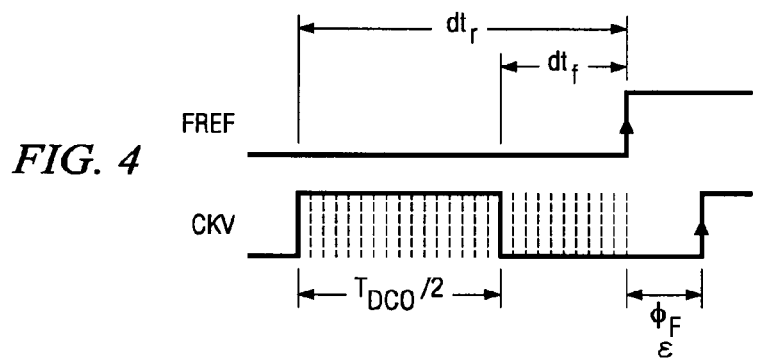
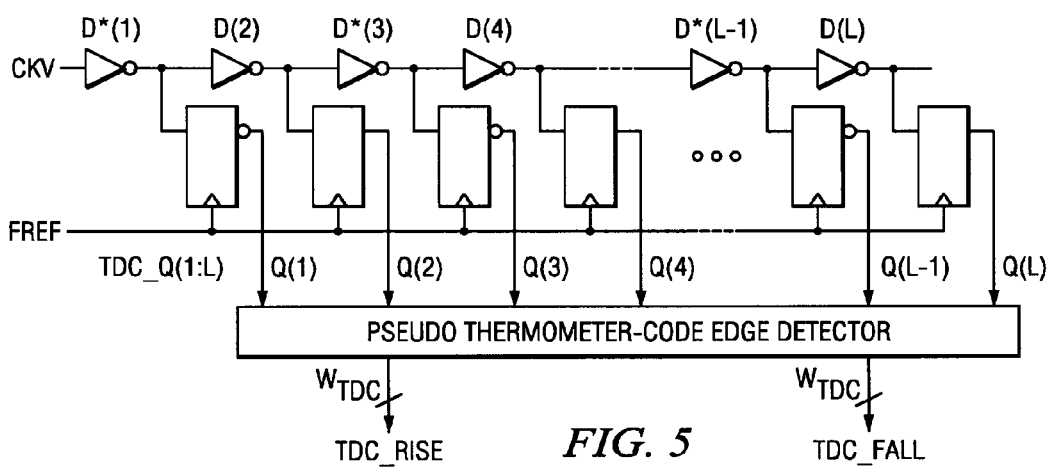

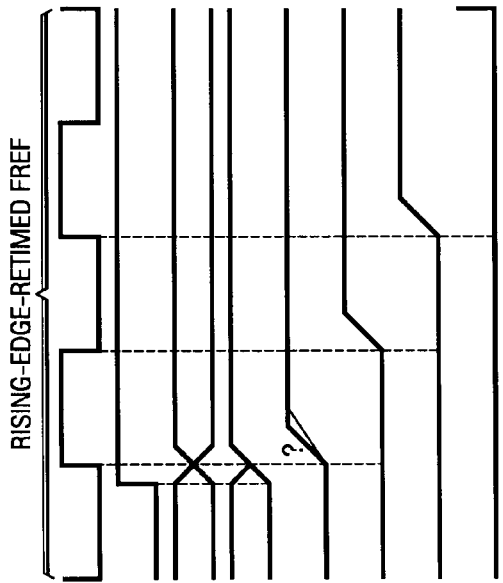
FIG. 10
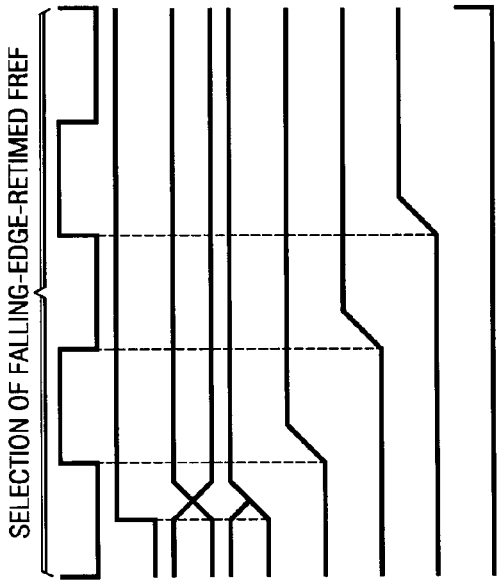
FIG. 11
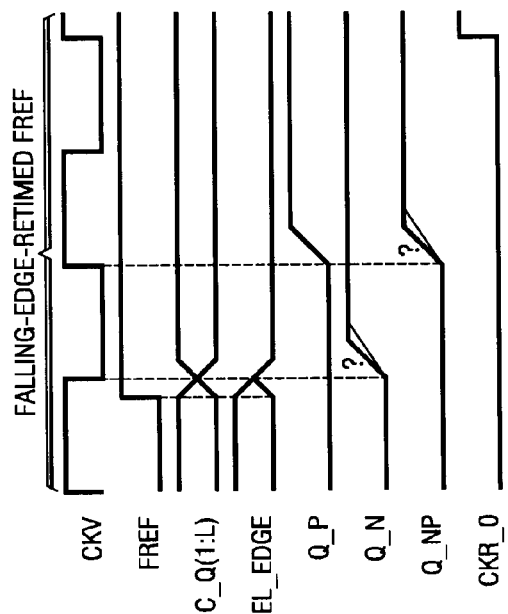
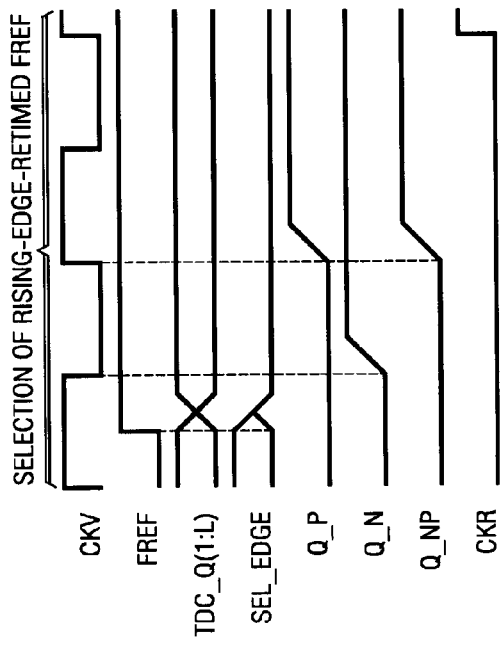

METHOD AND APPARATUS FOR ASYNCHRONOUS CLOCK RETIMING

CROSS-REFERENCE TO RELATED APPLICATIONS

This application claims the benefit of U.S. Provisional Application No. 60/242,577, entitled "Asynchronous Clock Retiming Method", filed on Oct. 23, 2000.

TECHNICAL FIELD

This invention relates in general to the field of electronics and more specifically to a method for asynchronous clock retiming.

BACKGROUND

Retiming a lower frequency timing signal (or clock) by a higher frequency clock, when both signals are asynchronous to each other, is typically done by passing the lower frequency signal through a series of registers (e.g., flip-flops) that are clocked using the higher frequency clock. There is however, a certain probability of a metastability condition per register stage and the overall probability of metastability at the system output increases exponentially with each register stage used. The number of registers is established such that the Mean Time Between Failures (MTBF) rate is acceptably small. Unfortunately, the metastability condition brings with it the timing uncertainty of one high speed clock (possibly higher) since, during metastability, the output could be resolved at a given clock period or at the next. Although the output levels are defined, this timing error is unacceptable in some applications. A need thus exist in the art for a method for asynchronous clock retiming that can overcome some of the problems mentioned above.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

FIG. 2 shows a time-to-digital converter (TDC) and period normalization block, forming a fractional phase detector.

FIG. 3 shows a timing diagram highlighting a negative fractional phase error condition.

FIG. 4 shows a timing diagram highlighting a positive fractional phase error condition.

FIG. 5 shows a circuit that is used to determine the "raw" digital fractional phase.

FIG. 10 shows a timing diagram for the circuit in FIG. 9.

FIG. 11 shows the selection of the rising-edge-retimed FREF signal or the falling-edge-retimed FREF in accordance with the invention.

DETAILED DESCRIPTION OF THE PREFERRED EMBODIMENT

Figure 1:
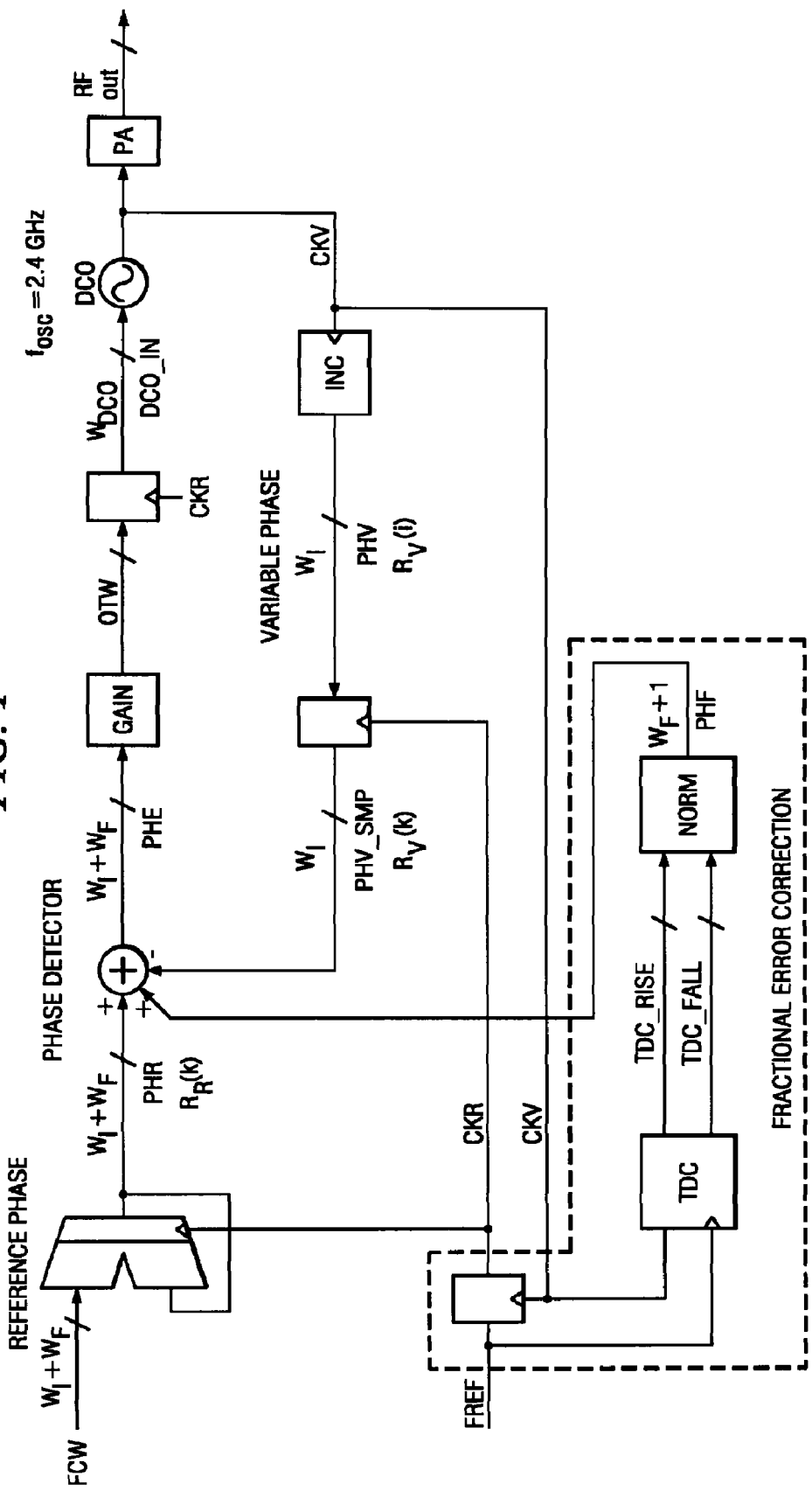
FIG. 1 shows a block diagram of a phase-domain all-digital synchronous PLL synthesizer that uses the present invention.
Figure 6:
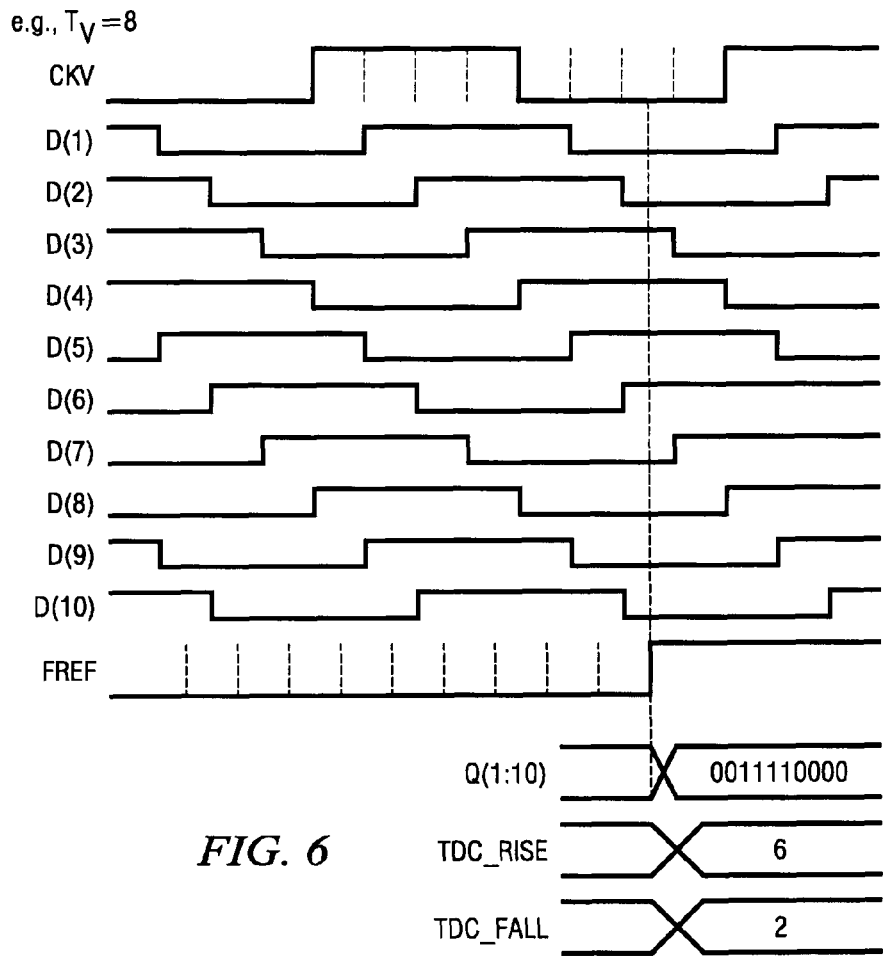
FIG. 6 shows a timing diagram for the circuit shown in FIG. 5.

While the specification concludes with claims defining the features of the invention that are regarded as novel, it is believed that the invention will be better understood from a consideration of the following description in conjunction with the drawing figures.

The method described herein is a general solution to the problem of retiming a lower frequency timing signal (or clock) by a higher frequency clock when both signals are asynchronous to each other. In the following described embodiment, the timing signal is a Frequency-Reference clock (FREF), the oversampling clock is a Digitally-Controlled Oscillator (DCO) clock output. Obviously, both of these signals are completely asynchronous to each other. The preferred embodiment will describe the invention in association with a frequency synthesizer based on a phase-domain All-Digital-Phase-Lock-Loop (ADPLL) structure although the invention can be used in any application where an asynchronous clock retiming is required. A block diagram of an ADPLL synthesizer 100 that can use the present invention is shown in FIG. 1. The PLL loop is a fixed-point phase-domain architecture whose purpose is to generate an RF frequency in the 2.4 GHz Bluetooth band. The central element in synthesizer 100 is a digitally-controlled oscillator (DCO) and the PLL loop used is a fully digital and of type I (i.e., only one integrating pole due to the DCO frequency-to-phase conversion). The PLL loop arithmetically compares the accumulated frequency control word (FCW) in the reference phase accumulator $R_R(k)$ in order to arrive at the phase error correction. The FCW input to the reference accumulator is used to establish the operating frequency of the desired channel, and it is expressed in a fixed-point format such that 1 LSB of its integer part corresponds to the $f_R$ reference frequency.

A more detailed discussion of the synthesizer section can be found in a U.S. patent application entitled "Digital Phase-Domain PLL Frequency Synthesizer", by Staszewski, et al., having Ser. No. 09/603,023, filed on Jun. 26, 2000, this application is incorporated by reference as if fully set forth herein. A more detailed discussion of the fractional phase detector used in synthesizer 100 can be found in a U.S. patent application entitled "Digital Fractional Phase Detector", by Staszewski, et al., having Ser. No. 09/608,317, filed on Jun. 30, 2000, this application is incorporated by reference as if fully set forth herein.

In the ADPLL 100 the reference phase, variable (DCO) phase, phase error, and all other phase signals need to be represented as fixed-point digital word signals that are synchronous to each other and cannot be corrupted by noise. If this is accomplished, then the phase error can be simply an output of a synchronous arithmetic subtractor used as a phase detector. Thus retimed FREF clock (CKR) is used as a synchronous clock.

The ADPLL 100 uses a selection control circuit such as a time-to-digital converter (TDC) 202 to measure the fractional (sub-$T_v$) delay difference between both edges of the DCO clock and the reference clock with a time quantization and resolution of $\Delta t_{res}$. This difference is represented by a digital word, the timing diagram for a negative phase error are shown in FIG. 3, while the timing diagram for a positive phase error are shown in FIG. 4.

The digital fractional phase is determined by passing the DCO clock through a chain of inverters as shown in FIG. 5, such that each inverter output produces a clock signal slightly delayed than from the previous inverter. The staggered clock phases are then sampled by the same reference clock. Position of the detected transition from a logic 1 to a logic 0 indicates that a quantized time delay $\Delta t_r$ between the FREF sampling edge and the rising edge of the DCO clock, CKV, in $\Delta t_{res}$ multiples. Similarly, position of the detected transistion from a logic 0 to a 1 indicates a quantized time delay $\Delta t_f$ between the FREF sampling edge and the falling edge of the DCO clock, CKV. Because of the time-casual nature of this operation, both delay values must be interpreted as positive. This is fine if $\Delta t_r$ is samller than $\Delta t_f$. This corresponds to the negative phase error of the classical PLL loop in which the DCO edge is ahead of the reference edge and, therefore, the phase sign has to be negated. However, it is not so straightforward if $\Delta t_r$ is greater than $\Delta t_f$, which correponds to the positive phase error of the classical PLL loop.

The time lag between the reference edge and the following rising edge of the CKV must be calculated based on the available information of the delay between the preceeding rising edge of CKV and the reference edge and the clock half-period, which is the difference $T_v/2 = \Delta t_r - \Delta t_f$. In general, $$T_v/2 = \Delta t_r - \Delta t_f \text{ if } \Delta t_r \geq \Delta t_f, \text{ otherwise } \Delta t_f - \Delta t_r.$$

The above analysis can be summarized in equation in the following equation, where $\Delta t_{frac}$ is the digital fractional phase detector output:

$$\Delta t_{frac} = -\Delta t_r \text{ if } \Delta t_r \geq \Delta t_f, \text{ otherwise } \Delta t_r - 2\Delta t_f.$$

The period-normalized fractional phase is described by:

$$\phi F = \frac{\Delta t_{frac}}{T_v}.$$

In this implementation, the fractional phase is not needed. Instead, $\Delta t_r$ is used as the $\epsilon(k)$ correction that is positive and $\epsilon \in (0, 1)$, in the following equation: $\theta_r(k) = k \cdot N + \theta_0 + \epsilon(k)$, where $\theta_r(k)$ is the reference phase, k is an index, the $\theta_v(k)$ is the high-rate DCO phase, and $\epsilon(k) = \Delta t_r(k) T_v$.

In practice, it is preferred to obtain the clock period through longer-term averaging in order to ease the calculation burden and linearize the transfer function of $1/T_v$. The averaging time constant can be as slow as the expected drift of the inverter delay.

Figure 7:
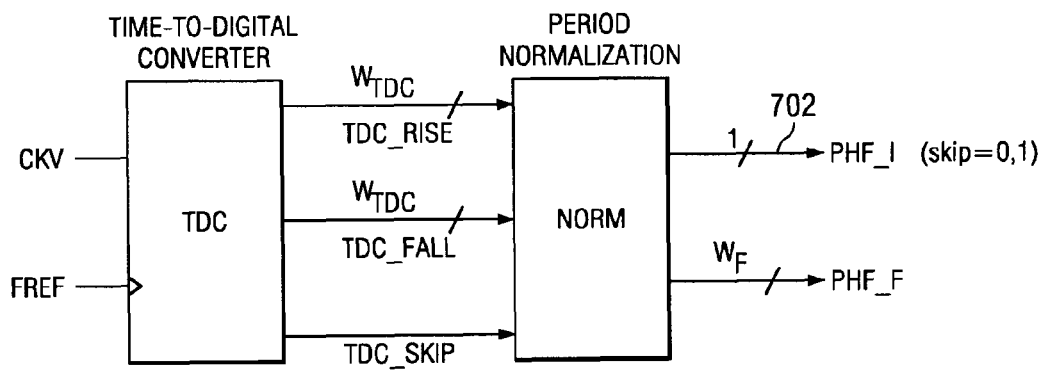
FIG. 7 shows a TDC and period normalization block that provide for edge skipping.
Figure 8:
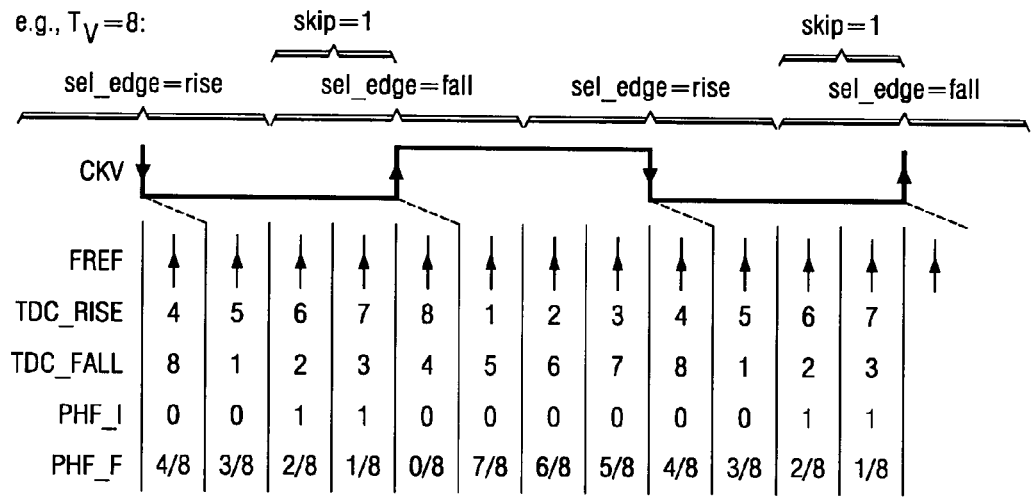
FIG. 8 shows a timing diagram for the circuit shown in FIG. 7.

The actual fractional output of the error correction "$\epsilon$" needs one extra bit due to the fact that the whole CKV cycle has to be skipped, if the rising edge of FREF transitions is too close before the rising edge of CKV and, as a safety precaution, the falling CKV edge has to be used. This scenario is illustrated in FIGS. 7 and 8. Output PHF_I 702 is of the integer least-significant-bit (LSB) weight.

The clock retiming solution in accordance with the invention uses the previously-described TDC circuit to determine which edge of the higher frequency clock (oversampling clock) is -farther away, or far enough based on the design criteria, from the edge of the lower frequency timing signal. Alternatively, in another design, the circuit only needs to find an edge that is far enough to guarantee a low probability of metastability. In this case, it could well be that either edge meets a "far enough" threshold. This predetermined threshold can be determined on a design by design case, and it is usually acceptable for timing values larger than several inverter delays. At the same time, the oversampling clock performs sampling of the timing signal by two registers, one on the rising edge and the other on the falling edge. Then the register of "better quality" retiming, as determined by the fractional phase detector decision, is selected to provide the retimed output.

Figure 9:
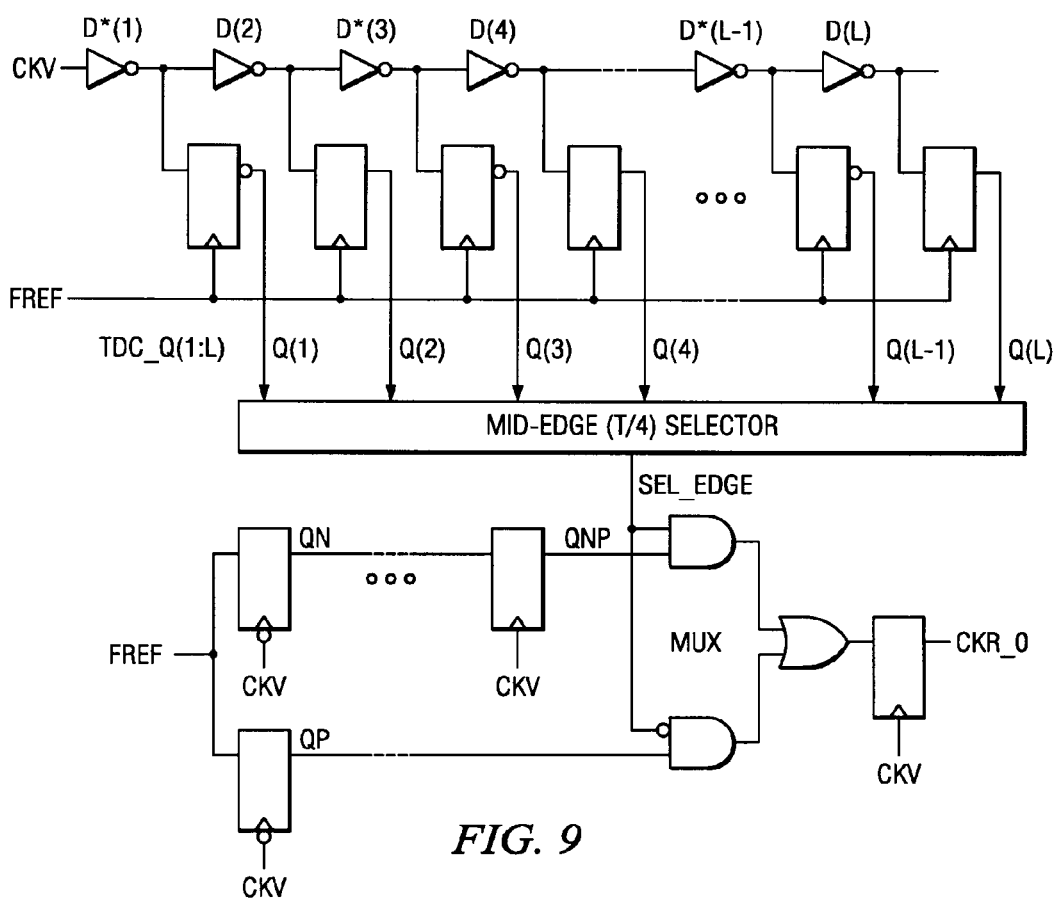
FIG. 9 shows a DCO clock retiming circuit in accordance with the invention.

In FIG. 9, there is shown a circuit that allows for the ADPLL 100 to synchronize the reference and variable clock signals in accordance with the invention. Both of the retimed signal paths are provided to a selection circuit such as a multiplexer (mux). In FIG. 10, there is shown the potential metastability of the falling-edge-retimed FREF and the potential metastability of the rising-edge-retimed FREF. The sole purpose is to resample the reference clock with a variable DCO clock as required in order to avoid metastability. It does so by resampling the FREF by both edges of CKV and choosing the one that has the larger clock separation. The select decision is based on the existing TDC output, thus little additional cost is incurred. In case of FREF resampling with the falling edge of CKV, an additional rising-edge CKV retiming is required.

Figure 12:
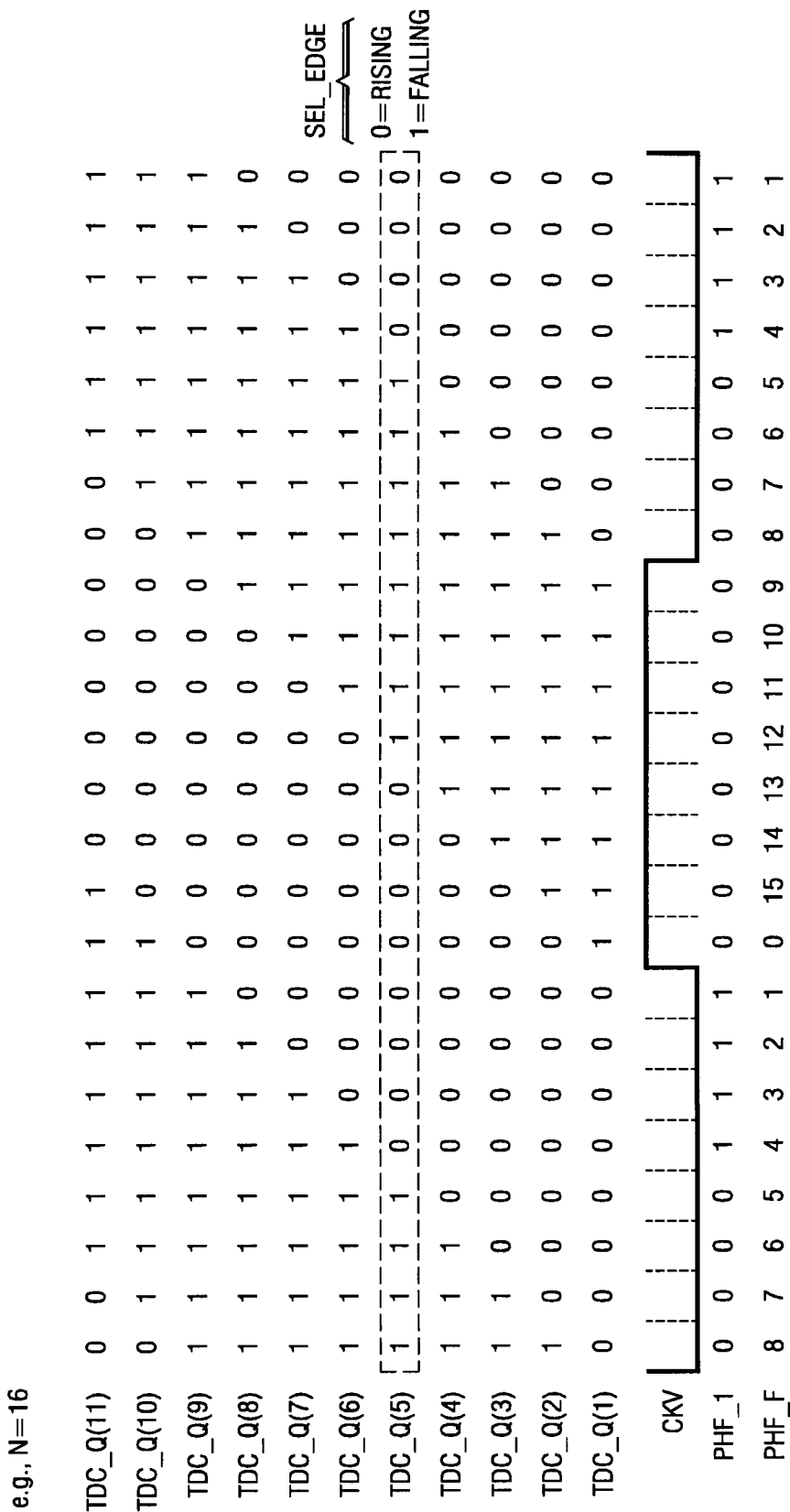
FIG. 12 shows details of the DCO clock retiming in accordance with the invention.

A high degree of redundancy in the thermometer-encoded TDC output vector could be exploited to obtain extra error correction and metastability resolution. However, in the preferred embodiment we have chosen a simple extraction of the selection control. In FIG. 11 there is shown a timing diagram highlighting the selection of the rising-edge-retimed FREF signal and the selection of the falling-edge-retimed FREF signal. FIG. 12 highlights how a certain single TDC register output can be used for the edge selection. It is also shown in FIGS. 7-12 that it is necessary to skip the whole CKV clock cycle if the FREF rising edge is close to the CKV rising edge. Consequently, an extra bit of information is sent to the phase detector. Several additional pairs of rising/falling reclocking stages are inserted to allow extra time (in multiple of CKV clock cycles) for the SEL_EDGE selection signal to resolve its metastability.

The asynchronous retiming method of the present invention begins by sampling the frequency reference clock (FREF) using both edges of an oversampling clock (CKV) that is derived from a controllable oscillator, such as a DCO. The sampling is preferably performed by a pair of clocked memory elements, such as flip-flops or registers, one operating on the positive or rising transition of the CKV clock, and the other operating on the negative or falling transition of the CKV clock. The effect of sampling the FREF clock by the CKV clock is to retime the FREF to either the rising or falling edge of the CKV clock.

By using a circuit like a time-to-digital converter to determine which edge of a higher frequency clock (e.g., oversampling clock) is farther away from the significant edge of the lower frequency timing signal, provides for improved asynchronous clock retiming. When the retiming method of the present invention is used in an all-digital PLL synthesizer, as one example, the retimed FREF can be used as a synchronous clock for the synthesizer. The retimed frequency reference (CKR) can be generated using a digitally-controlled oscillator (DCO) output as the oversampling clock. Thus providing for an improved and lower cost design.

What is claimed is:

1. A method for asynchronous retiming using a clock signal (FREF), and an oversampling clock signal (CKV), comprising the steps of:
    sampling the FREF using both the rising and falling edges of the CKV to produce first and second retimed FREF signals;
    selecting from either the first or second retimed FREF signals one that provides a predetermined level of metastability;

wherein the sampling step comprises sampling by the rising edges of the CKV using a first clocked memory element and sampling by the falling edges of the CKV using a second clocked memory element;
wherein the sampling step produces both rising and falling edge retimed signal paths, and
choosing from either the rising or falling edge signal paths, the signal path that is furthest away from metastability; and
wherein the choosing step is performed by a midedge detector that comprises a time-to-digital converter (TDC) that is clocked by the FREF.

2. The method of claim 1, wherein the frequency of the clock signal FREF is lower than the frequency of the oversampling clock signal CKV.

3. The frequency synthesizer of claim 2, wherein the retiming circuit comprises:
a sampling circuit for sampling the FREF using both edges of the CKV and producing first and second retimed signals; and
a selection control circuit coupled to the sampling circuit for selecting from the first and second retimed signals a signal that corresponds to a sufficiently far threshold of separation between the FREF and the CKV.

4. The frequency synthesizer of claim 2, wherein the retiming circuit comprises:
a delay circuit for delaying the CKV to produce a delayed CKV signal;
a first sampling circuit for sampling the delayed CKV signal to produce a selection signal;
a second sampling circuit for sampling the FREF using both edges of the CKV and producing first and second retimed signals; and
a selection control circuit coupled to the first and second sampling circuits for selecting from the first and second retimed signals based on the selection signal.

5. A method for asynchronous retiming using a clock signal (FREF), and an oversampling clock signal (CKV), comprising the steps of:
sampling the FREF using both the rising and falling edges of the CKV to produce first and second retimed FREF signals;
selecting from either the first or second retimed FREF signals one that provides a predetermined level of metastability;
wherein the sampling step comprises sampling by the rising edges of the CKV using a first clocked memory element and sampling by the falling edges of the CKV using a second clocked memory element;
wherein the sampling step produces both rising and falling edge retimed signal paths, and
choosing from either the rising or falling edge signal paths, the signal path that is furthest away from metastability; and
wherein the choosing step is performed by a midedge detector that determines which one of the two CKV edges lies farther away from an edge of the FREF.

6. The method of claim 5, wherein the frequency of the clock signal FREF is lower than the frequency of the oversampling clock signal CKV.

7. A method for asynchronous retiming using a clock signal (FREF), and an oversampling clock signal (CKV), comprising the steps of:
sampling the FREF using both the rising and falling edges of the CKV to produce first and second retimed FREF signals; and
selecting from either the first or second retimed FREF signals one that provides a predetermined level of metastability;
delaying the CKV; and
sampling the delayed CKV using the FREF such that the selected retimed signal is sufficiently away from a metastability condition.

8. A method as defined in claim 7, wherein the sampling step comprises sampling by the rising edges of the CKV using a first clocked memory element and sampling by the falling edges of the CKV using a second clocked memory element.

9. A method as defined in claim 8, wherein the first and second clocked memory elements comprise registers or flip-flops.

10. A method as defined in claim 8, wherein the retiming step produces both rising and falling edge retimed signal paths, and the method further comprising the step of:
providing both the rising and falling edge retimed signal paths to a selection circuit.

11. A method as defined in claim 10, further comprising the step of:
delaying both the rising and falling edge retimed signal paths by a controllable amount.

12. The method as defined in claim 10, wherein the selection circuit comprises a multiplexer.

13. A method as defined in claim 11, wherein the delaying step is performed by introducing a predetermined number of shift register stages that are clocked by the CKV or a clock signal derived from the CKV.

14. The method as defined in claim 12 wherein the multiplexer has an output that is resampled by the CKV.

15. The method as defined in claim 8, wherein the retiming step produces both rising and falling edge retimed signal paths, and further comprising the step of:
choosing from either the rising or falling edge signal paths, the signal path that is furthest away from metastability.

16. The method of claim 7, wherein the oversampling clock signal (CKV) is an oscillator output and the clock signal (FREF) is a frequency reference signal.

17. The method of claim 7, wherein the frequency of the clock signal FREF is lower than the frequency of the oversampling clock signal CKV.

18. A circuit for asynchronous retiming using a first clock signal and a second clock signal, said second clock signal having a higher frequency than the first clock signal, the circuit comprising:
a sampling circuit for sampling the first clock signal using both edges of the second clock signal and producing first and second retimed signals; and
a selection control circuit coupled to the sampling circuit for selecting from the first and second retimed signals the signal that provides at least a predetermined level of metastability; and
wherein the selection control circuit comprises a time-to-digital converter (TDC).

19. A circuit as defined in claim 18, wherein the sampling circuit comprises a pair of clocked memory elements.

20. A circuit as defined in claim 18, wherein the TDC selects which of the first and second retimed signals to select by determining which edge of the second clock signal is farther away from a significant edge of the first clock signal.

21. A circuit as defined in claim 18, further comprising a multiplexer coupled to the selection control circuit.

22. A circuit for asynchronous retiming using a first clock signal and a second clock signal, said second clock signal having a higher frequency than the first clock signal, the circuit comprising:

a sampling circuit for sampling the first clock signal using both edges of the second clock signal and producing first and second retimed signals;

a selection control circuit coupled to the sampling circuit for selecting from the first and second retimed signals the signal that provides at least a predetermined level of metastability; and a delay circuit coupled to the selection circuit for delaying the first and second retimed signals.

23. A circuit as defined in claim 22, wherein the delay circuit comprises at least one shift register.

24. A method for asynchronous retiming using a clock signal (FREF), and an oversampling clock signal (CKV), comprising the steps of:

delaying the CKV to produce a delayed CKV signal;

sampling the delayed CKV signal with FREF to produce a selection signal;

sampling the FREF using both rising and falling edges of the CKV to produce first and second retimed FREF signals; and selecting from either the first or second retimed FREF signals based on the selection signal.

25. A method for asynchronous retiming comprising the steps of:

using a lower frequency clock signal (FREF), and a higher frequency clock signal (CKV);

sampling the FREF using both the rising and falling edges of the CKV to produce first and second retimed FREF signals; and selecting from either the first or second retimed FREF signals one that corresponds to a farther separation between the FREF and the respective edge of the CKV.

26. A method for asynchronous retiming comprising the steps of:

using a lower frequency clock signal (FREF), and a higher frequency clock signal (CKV);

sampling the FREF using both the rising and falling edges of the CKV to produce first and second retimed FREF signals; and selecting from either the first or second retimed FREF signals one that corresponds to a sufficiently far threshold of separation between the FREF and the respective edge of the CKV.

27. A circuit for asynchronous retiming using a first clock signal and a second clock signal, said second clock signal having a higher frequency than the first clock signal, the circuit comprising:

a sampling circuit for sampling the first clock signal using both edges of the second clock signal and producing first and second retimed signals; and a selection control circuit coupled to the sampling circuit for selecting from the first and second retimed signals the signal that corresponds to a farther separation between the first clock signal and the respective edge of the second clock signal.

28. A circuit for asynchronous retiming using a first clock signal and a second clock signal, said second clock signal having a higher frequency than the first clock signal, the circuit comprising:

a sampling circuit for sampling the first clock signal using both edges of the second clock signal and producing first and second retimed signals; and a selection control circuit coupled to the sampling circuit for selecting from the first and second retimed signals the signal that corresponds to a sufficiently far threshold of separation between the first clock signal and the respective edge of the second clock signal.

* * * * *